(12) United States Patent
Xu et al.

(10) Patent No.: US 8,527,830 B2
(45) Date of Patent: *Sep. 3, 2013

(54) ENCODING METHOD, ENCODING DEVICE, DECODING METHOD AND DECODING DEVICE FOR LOW DENSITY GENERATOR MATRIX CODES

(75) Inventors: Jin Xu, Shenzhen (CN); Jun Xu, Shenzhen (CN); Zhifeng Yuan, Shenzhen (CN); Yuanli Fang, Shenzhen (CN); Song Li, Shenzhen (CN); Liujun Hu, Shenzhen (CN)

(73) Assignee: ZTE Corporation, Shenzhen, Guangdong (CN)

( * ) Notice: Subject to any disclaimer, the term of this patent is extended or adjusted under 35 U.S.C. 154(b) by 498 days.

This patent is subject to a terminal disclaimer.

(21) Appl. No.: 12/746,756

(22) PCT Filed: Apr. 16, 2008

(86) PCT No.: PCT/CN2008/070728
§ 371 (c)(1),
(2), (4) Date: Jun. 7, 2010

(87) PCT Pub. No.: WO2009/074024
PCT Pub. Date: Jun. 18, 2009

(65) Prior Publication Data
US 2010/0269010 A1    Oct. 21, 2010

(30) Foreign Application Priority Data

Dec. 7, 2007 (CN) .......................... 2007 1 0198973

(51) Int. Cl.
*H03M 13/00* (2006.01)
(52) U.S. Cl.
USPC ........................................................ 714/752

(58) Field of Classification Search
USPC ........................................................ 714/752
See application file for complete search history.

(56) References Cited

U.S. PATENT DOCUMENTS 7,222,284 B2 * 5/2007 Stolpman ................... 714/774
7,757,150 B2 * 7/2010 Stolpman ................... 714/752

(Continued)

OTHER PUBLICATIONS

Garcia-Frias et al., Approaching Shannon Performance by Iterative Decoding of Linear Codes with Low-Density Generator Matrix, IEEE Communications Letters, vol. 7, No. 6, Jun. 2003, pp. 266-268.
Fu et al., LDGM Coded Space-Time Trellis Codes from Differential Encoding, IEEE Communications Letters, vol. 11, No. 1, Jan. 2007, pp. 61-63.
PTC; International Search Report for PTC/CN2008/070728; Aug. 14, 2008.

*Primary Examiner* — Amine Riad
(74) *Attorney, Agent, or Firm* — Li & Cai Intellectual Property (USA) Office

(57) ABSTRACT

An encoding method, encoding device, decoding method and decoding device for low density generator matrix codes (LDGC) are disclosed. Wherein, the encoding method comprises: construct an LDGC mother code set using P LDGC with code rate $R_0$ and different code lengths, wherein the LDGC mother code set has a uniform basic matrix $G_b^{uniform}$ wherein, $$R_0 = \frac{k_b}{n_b},$$

$k_b$ denotes the number of rows and $n_b$ denotes the number of columns in the basic matrix; obtain length L of an intermediate variant according to length K of an information bit sequence to be encoded in the LDGC mother code set; modify and expand the basic matrix to obtain a generator matrix $G_{ldgc}$ using the length L of the intermediate variant and the number $k_b$ of rows in the basic matrix; and encode the information bit sequence to be encoded using a matrix $G_{ldgc}$ (1:L,1:N+L−K) composed of L rows and the front N+L−K columns of the generator matrix, wherein N denotes the length of the encoded information.

20 Claims, 8 Drawing Sheets

(56) References Cited

U.S. PATENT DOCUMENTS

| | | | |
|---|---|---|---|
| 7,774,675 B1 * | 8/2010 | Matache et al. | 714/755 |
| 7,831,895 B2 * | 11/2010 | Lin | 714/800 |
| 7,934,146 B2 * | 4/2011 | Stolpman | 714/800 |
| 8,086,929 B2 * | 12/2011 | Chung et al. | 714/752 |
| 2007/0245211 A1 | 10/2007 | Kim et al. | |

* cited by examiner

US 8,527,830 B2

ENCODING METHOD, ENCODING DEVICE, DECODING METHOD AND DECODING DEVICE FOR LOW DENSITY GENERATOR MATRIX CODES

CROSS-REFERENCE TO RELATED APPLICATIONS

This application is the U.S. National Phase application under 35 U.S.C. §371 of International Application PCT/CN2008/070728 filed on Apr. 16, 2008, which claims priority to Chinese Application 200710198973.0 filed Dec. 7, 2007. The entirety of the two of these applications is hereby incorporated by reference.

FIELD OF THE INVENTION

The present invention relates to communication field, in particular to an encoding method, encoding device, decoding method and decoding device for Low Density Generator matrix Codes, LDGC.

BACKGROUND OF THE INVENTION

Erasure channel is an important channel model. For example, when files are transmitted on the Internet, communications are based on data packets, and usually, each data packet is either received by a receiver without any mistake, or not received by the receiver at all. In the Transmission Control Protocol (TCP for short), an error-check and retransmission mechanism is used against network packet loss, i.e., a feedback channel from an input end to an output end is used to control data packets which need to be retransmitted. The receiver generates a retransmission control signal upon detecting a packet loss, until the complete data packet is received correctly; and the receiver also generates a receiving Acknowledgement (ACK) signal upon receiving a data packet. A sender also traces each data packet until it receives a feedback informing signal, otherwise, the sender starts a retransmission.

The data broadcasting service based on streaming mode and file downloading mode is a point-to-multipoint service, in which no feedback is allowed and the conventional error-check and retransmission mechanism cannot be used, and thus Forward Error Correction (FEC for short) needs to be used to ensure reliable transmission. Typical FECs in the application layer comprises RS codes (Reed-Solomon codes), Fountain codes etc. The RS codes are of high complexity in encoding and decoding, and usually are applicable only in the cases where the code length is small LT codes (Luby Transform codes) and Raptor codes are two kinds of Fountain codes applicable in practice. The LT codes have linear encoding and decoding time, and thus have substantial improvement compared to the RS codes. The Raptor codes have higher decoding efficiency because of the use of pre-coding technique. The Raptor codes are used as the FEC encoding scheme in Multimedia Broadcast/Multicast Service (MBMS for short) and Digital Video Broadcasting (DVB for short) of 3GPP ($3^{rd}$ Generation Partnership Project).

Low Density Generator matrix Codes (LDGC for short) are linear block codes, and the nonzero elements in the generator matrix thereof are usually sparse. Meanwhile, the LDGC are also systematic codes, and the square matrix composed of the front k columns of the generator matrix thereof is generally an upper triangular or lower triangular matrix, the inversion of which can be computed by iteration method. The encoding of the LDGC is to compute an intermediate variant using the corresponding relation between the information bits and the intermediate variant in the systematic codes, and then, to obtain encoded codewords by multiplying the generator matrix by the intermediate variant. The decoding process of the LDGC is to first compute an intermediate variant using the generator matrix, and then, to compute the information bits using the conversion relation between the information bits and the intermediate variant. The LDGC are much lower than the Raptor codes in encoding complexity, can support the encoding of any information block length and any code rate, and are similar to the Raptor codes in performance which can be close to the theoretical optimal performance.

Compared to the structured Low Density Generator Matrix Codes (LDGC), the LT codes do not support the encoding mode of the systematic codes. Thus, the LT codes can not satisfy some practical FEC encoding requirements. The Raptor codes support the systematic codes, however, the Raptor codes need a separate pre-coding process, i.e., a pre-coding matrix is needed, thus, the encoding complexity is high. The LDGC directly use a generator matrix for encoding, without any additional pre-coding matrix. Moreover, since the backward substitution method is used in the encoding of the LDGC to solve the upper triangular (or lower triangular) formulae, the LDGC are much lower than the Raptor codes in encoding complexity. In a word, compared to the LT codes, the advantage of the LDGC lies in that it supports the systematic codes; and compared to the Raptor codes, the advantage of the LDGC lies in that it has a lower encoding complexity.

SUMMARY OF THE INVENTION

In view of one or more problems as mentioned above, the present invention provides an encoding method, encoding device, decoding method and decoding device for structured LDGC.

An encoding method for LDGC according to the embodiments of the present invention comprises the following steps: step 1, construct an LDGC mother code set using P LDGC with code rate $R_0$ and different code lengths, wherein the LDGC mother code set has a uniform basic matrix $G_b^{uniform}$, $$R_0 = \frac{k_b}{n_b},$$

$k_b$ denotes the number of rows in the basic matrix, and $n_b$ denotes the number of columns in the basic matrix; step 2, obtain length L of an intermediate variant according to length K of an information bit sequence to be encoded in the LDGC mother code set; step 3, modify and expand the basic matrix to obtain a generator matrix $G_{ldgc}$ using the length L of the intermediate variant and the number $k_b$ of rows in the basic matrix; and step 4, encode the information bit sequence to be encoded using a matrix $G_{ldgc}$(1:L, 1:N+L−K) composed of L rows and the front N+L−K columns of the generator matrix, wherein N denotes the length of the encoded information.

Wherein, in step 2, the length L of the intermediate variant is obtained using the length K of the information bit sequence to be encoded through a formula L=modify(a×K+b), wherein modify( ) denotes integer modification, the modification methods are ceiling, floor, and rounding, a is a positive rational number slightly larger than 1, and b is a positive integer.

Wherein, step 3 comprises the following steps: step a, obtain an expanding factor $z_t$ using the length L of the inter mediate variant and the number $k_b$ of rows of the basic matrix through a formula $$z_t = \frac{L}{k_b},$$

and finding an expanding factor $Z_k$, which has a relation of $z_{k-1} < z_t \leq z_k$ with the expanding factor $z_t$ and is used for processing the basic matrix, from an expanding factor set $Z_{set}$ composed of P positive integers larger than 0 $z_1 < z_2 < \ldots < z_{k-1} < z_k < \ldots < z_p$ and corresponding to the LDGC mother code set; step b, modifying the basic matrix to obtain a modified basic matrix $G_b^{modified}$ using the expanding factor $Z_k$ for processing the basic matrix; step c, expanding the modified basic matrix to obtain an unmodified generator matrix G' using the expanding factor $Z_k$ for processing the basic matrix; and step d, modifying the unmodified generator matrix G' to obtain an generator matrix $G_{ldgc}$.

Wherein, step 4 comprises the following steps: step e, add L–K known bits to an information bit sequence to be encoded to generate an information bit sequence m with the length L; step f, according to a formula I×$G_{ldgc}$ (1:L,1:L)=m, obtain an intermediate variant I using a square matrix $G_{ldgc}$ (1:L,1:L) composed of L rows and the front L columns of the generator matrix and the information bit sequence m with the length L, and according to a formula C=I×$G_{ldgc}$, encoding the intermediate variant using the matrix $G_{ldgc}$ (1:L, 1:N+L–K) composed of L rows and the front N+L–K columns of the generator matrix to generate a first encoding result with the length N+L–K; and step g, deleting L–K known bits from the first encoding result with the length N+L–K to generate a second encoding result with the length N.

Wherein the number $k_b$ of the rows of the basic matrix is an integer larger than 2, and the number $n_b$ of the columns of the basic matrix is an integer larger than or equal to 1. In step d, the generator matrix $G_{ldgc}$ is obtained by increasing the column weight of a specific column of the unmodified generator matrix G'.

An encoding device for LDGC according to the embodiments of the present invention comprises: basic matrix storing means for storing a uniform basic matrix $G_b^{uniform}$ of an LDGC mother code set constructed by using P LDGC with code rate $R_0$ and different code lengths, wherein $$R_0 = \frac{k_b}{n_b},$$

$k_b$ denotes the number of rows in the basic matrix, and $n_b$ denotes the number of columns in the basic matrix; matrix parameter computing means for computing length L of an intermediate variant according to the relation between the length K of an information bit sequence to be encoded in the LDGC mother code set and the length L of the intermediate variant, computing an expanding factor $Z_k$ for processing the basic matrix using the length L of the intermediate variant and the number $k_b$ of rows of the basic matrix, and performing modifying and expanding computation on the basic matrix to obtain a generator matrix $G_{ldgc}$ using the expanding factor $Z_k$; bit filling means for adding L–K known bits to the information bit sequence to be encoded to generate an information bit sequence m with the length L; pre-coding means for obtaining, according to a formula I×$G_{ldgc}$ (1:L,1:L)=m, the intermediate variant I using a square matrix $G_{ldgc}$ (1:L,1:L) composed of L rows and the front L columns of the generator matrix and the information bit sequence m with the length L; block code encoding means for encoding the intermediate variant using a matrix $G_{ldgc}$ (1:L, 1:N+L–K) composed of L rows and the front N+L–K columns of the generator matrix to generate a first encoding result with length N+L–K; and bit deleting means, for deleting L–K known bits from the first encoding result with the length N L–K to generate a second encoding result with length N. Wherein, the square matrix $G_b^{uniform}$ (1:$k_b$,1:$k_b$) composed of $k_b$ rows and the front $k_b$ columns of the basic matrix is an upper triangular or lower triangular matrix.

Wherein, the matrix parameter computing means obtains an expanding factor $z_t$ using the length L of the intermediate variant and the number $k_b$ of rows of the basic matrix according to a formula $$z_t = \frac{L}{k_b},$$

and finds an expanding factor having a relation of $z_{k-1} < z_t \leq z_k$ with the expanding factor $z_t$ from an expanding factor set $Z_{set}$ composed of P positive integers larger than 0 $z_1 < z_2 < \ldots < z_{k-1} < z_k < \ldots < z_p$ and corresponding to the LDGC mother code set, so as to obtain $Z_k$ for processing the basic matrix.

Wherein, the matrix parameter computing means modifies the basic matrix to obtain a modified basic matrix $G_b^{modified}$ using the expanding factor $Z_k$ for processing the basic matrix, expands the modified basic matrix to obtain an unmodified generator matrix G' using the expanding factor $Z_k$ for processing the basic matrix, and modifies the unmodified generator matrix G' to obtain the generator matrix $G_{ldgc}$.

Wherein the matrix parameter computing means modifies the unmodified generator matrix G' by increasing the column weight of a specific columns of the unmodified generator matrix G'.

A decoding method for LDGC according to the embodiments of the present invention comprises the following steps: step 1, obtain a reception generator matrix $G_{ldgc}$ (:,$r_1, r_2, \ldots r_i$) by modifying and expanding a basic matrix $G_b^{uniform}$ using an expanding factor $Z_k$ used in an encoding process; step 2, fill L–K known bits in encoded LDGC having passed an erasure channel to obtain LDGC C($r_1, r_2, \ldots r_i$)=[$C_{r1}, C_{r2}, C_{r3}, \ldots, C_{ri}$] to be decoded, wherein i is a positive integer which satisfies L≦i≦N+L–K, L is the length of an intermediate variant used in the encoding process, N is the length of encoded LDGC having not passed the erasure channel, K is the length of LDGC before encoding; step 3, according to a formula C(:,$r_1, r_2, \ldots r_i$)=I*$G_{ldgc}$ (:,$r_1, r_2, \ldots r_i$), obtain 1*L reception intermediate vector I using the reception generator matrix and the LDGC to be decoded; step 4, according to a formula I*$G_{ldgc}$ (1:L,1:L)=m, obtain a decoding result m with length L using a square matrix $G_{ldgc}$ (1:L,1:L) composed of L rows and the front L columns of the reception generator matrix and the reception intermediate vector; and step 5, obtain a decoding result with length K by deleting the L–K known bits from the decoding result m with the length L.

Wherein, the reception generator matrix retains column vectors corresponding to the serial numbers of all the non-erasure positions in the matrix $G_{ldgc}$ (1:L,1:N+L–K) composed of L rows and the front N+L–K columns of the generator matrix used in the encoding process.

Wherein, step 3 comprises the following steps: step a, perform row permutation, column permutation, and/or row elimination operation on the reception generator matrix $G_{ldgc}$ (:,$r_1, r_2, \ldots r_i$) using Gaussian elimination method to obtain a matrix comprising L*L upper triangular matrix; step b, according to the matrix comprising L*L upper triangular matrix, performing permutation and addition on the LDGC to be decoded, and perform permutation on the intermediate variant used in the encoding process; and step c, solve an upper trigonometric recursive formula using the backward substitution method to obtain the reception intermediate vector I.

Wherein, step a comprises the following steps: select a row with the smallest row weight in the reception generator matrix to perform row permutation with Row j; perform column permutation between the column where the first nonzero element of Row j lies in the reception generator matrix after the row permutation and Column j in the reception generator matrix after the row permutation; and eliminate the nonzero elements between Row j+1 and the last row in Column j in the reception generator matrix after the column permutation using the element in Row j and Column j in the reception generator matrix after the column permutation through row elimination method.

A decoding device for LDGC according to the embodiments of the present invention comprises: basic matrix storing means for storing a uniform basic matrix $G_b^{uniform}$ of an LDGC mother code set constructed by using P LDGC with code rate $R_0$ and different code lengths, wherein $$R_0 = \frac{k_b}{n_b},$$

$k_b$ denotes the number of rows in the basic matrix, and $n_b$ denotes the number of columns in the basic matrix; matrix parameter computing means for obtaining a reception generator matrix $G_{ldgc}(:,r_1, r_2, \ldots r_i)$ by modifying and expanding the basic matrix $G_b^{uniform}$ using an expanding factor $Z_k$ used in an encoding process; bit filling means for filling L−K known bits in an encoded LDGC having passed an erasure channel to obtain LDGC $C(r_1, r_2, \ldots r_i)=[C_{r1}, C_{r2}, C_{r3}, \ldots, C_{ri}]$ to be decoded, wherein i is a positive integer which satisfies L≦i≦N+L−K, L is the length of an intermediate variant used in the encoding process, N is the length of encoded LDGC having not passed the erasure channel, K is the length of the LDGC before encoding; upper triangular matrix computing means for performing row permutation, column permutation, and/or row elimination operation on the reception generator matrix $G_{ldgc}(:,r_1, r_2, \ldots r_i)$ using Gaussian elimination method to obtain a matrix comprising L*L upper triangular matrix; intermediate variant computing means for obtaining, according to a formula $C(:,r_1, r_2, \ldots r_i)=I*G_{ldgc}(:,r_1, r_2, \ldots r_i)$, 1*L reception intermediate vector I using the matrix comprising L*L upper triangular matrix and the LDGC to be decoded; block code decoding means for obtaining, according to a formula $I*G_{ldgc}(1:L,1:L)=m$, a decoding result m with length L using a square matrix $G_{ldgc}(1:L,1:L)$ composed of L rows and the front L columns of the reception generator matrix and the reception intermediate vector; and bit deleting means for obtaining a decoding result with length K by deleting the L−K known bits from the decoding result m with the length L.

Wherein, the matrix parameter computing means obtains an expanding factor $z_t$ using the length L of the intermediate variant used in the encoding process and the number $k_b$ of rows of the basic matrix through a formula $$z_t = \frac{L}{k_b},$$

and finds an expanding factor having a relation of $z_{k-1} < z_t \leq z_k$ with the expanding factor $z_t$ from an expanding factor set $Z_{set}$ composed of P positive integers larger than 0 $z_1 < z_2 < \ldots < z_{k-1} < z_k < \ldots < z_p$ and corresponding to the LDGC mother code set, so as to obtain an expanding factor $Z_k$ used in the encoding process.

Wherein, the matrix parameter computing means modifies the basic matrix to obtain a modified basic matrix $G_b^{modified}$ fied using the expanding factor $Z_k$ used in the encoding process, expands the modified basic matrix to obtain a basic generator matrix G using the expanding factor $Z_k$ used in the encoding process, and then, generates the reception generator matrix with L rows of the basic generator matrix G and columns corresponding to the serial numbers of the LDGC to be decoded.

Wherein, the upper triangular matrix computing means selects a row with the smallest row weight in the reception generator matrix to perform row permutation with Row j, performs column permutation between a column where the first nonzero element of Row j lies in the reception generator matrix after the row permutation and Column j in the reception generator matrix after the row permutation, and uses a row elimination method to eliminate the nonzero elements between Row j+1 and the last row in Column j in the reception generator matrix after the column permutation, with the element in Row j and Column j in the reception generator matrix after the column permutation, so as to obtain the matrix comprising L*L upper triangular matrix.

Wherein, in the case that the square matrix $G_{ldgc}(1:L,1:L)$ composed of L rows and the front L columns of the reception generator matrix is a left upper triangular or left lower triangular matrix, the L−K known bits are filled in the front of the encoded LDGC having passed the erasure channel; and in the case that the square matrix $G_{ldgc}(1:L,1:L)$ composed of L rows and the front L columns of the reception generator matrix is a right upper triangular or right lower triangular matrix, the L−K known bits are filled in the end of K−E bits of the encoded LDGC having passed the erasure channel, wherein, E is the number of code words erased from the front K code words after the encoded LDGC having not passed the erasure channel pass the erasure channel.

The present invention can improve the flexibility in code length of the LDGC and reduce the memory space of the basic matrix, and thereby the encoding and decoding complexity being decreased.

BRIEF DESCRIPTION OF THE
ACCOMPANYING DRAWINGS

The drawings herein are used to provide a further understanding of the present invention and constitute a part of this application. Exemplary embodiments of this invention and the description thereof are used to describe the present invention and shall not be construed as improper limitations on the same. In the accompanying drawings.

DETAILED DESCRIPTION OF THE PREFERRED EMBODIMENTS

Figure 1:
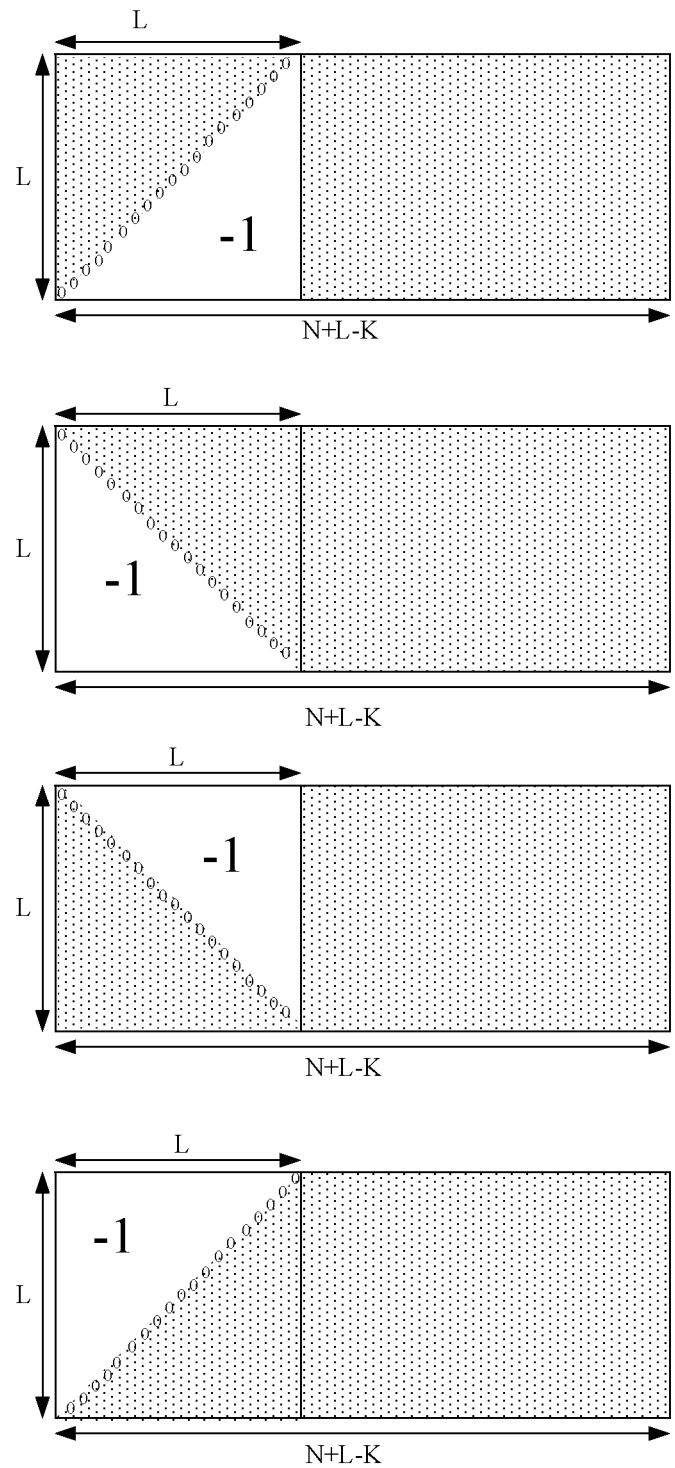
FIG. 1 is a schematic diagram of an upper/lower triangular basic matrix.

The encoding method for LDGC according to the present invention can be adapted to different code lengths, is simple to express, is favorable for standardization and storage of the basic matrix, and thus, is of a greater universality. Assume the generator matrix G of the LDGC is a (K×z)×(N×z) matrix composed of K×N block matrixes, each of which is a different power of a z×z basic permutation matrix. When the basic permutation matrixes are unit matrixes, they are all cyclic shift matrixes (shift to the right by defaulted in the text) of the unit matrixes in the following forms: if $g_{ij}^{b}=-1$, $P^{g_{ij}^{b}}=0$; if $g_{ij}^{b}$ is an integer larger than or equal to 0, define $P^{g_{ij}}=(P)^{g_{ij}}$, wherein P is a z×z standard permutation matrix as follows:

$$P = \begin{bmatrix} 0 & 1 & 0 & \ldots & 0 \\ 0 & 0 & 1 & \ldots & 0 \\ \ldots & \ldots & \ldots & \ldots & \ldots \\ 0 & 0 & 0 & \ldots & 1 \\ 1 & 0 & 0 & \ldots & 0 \end{bmatrix}.$$

Each block matrix can be exclusively identified through the power $g_{ij}^{b}$. The power of unit matrix can be denoted with 0, and zero matrix is generally denoted with −1. Thus, if each block matrix of G is replaced with its power, a $k_b \times n_b$ power matrix $G_b$ is obtained. Here, $G_b$ is defined as the basic matrix of G, and G is defined as the expansion matrix of $G_b$. In practical encoding, z=code length/the number $n_b$ of the columns of the basic matrix, and is referred to as an expanding factor.

For example, the matrix G can be obtained by expanding using the following parameter z and one 2×4 basic matrix $G_b$:

$$z = 3 \text{ and } G_b = \begin{bmatrix} 0 & 1 & 0 & -1 \\ 2 & 1 & 2 & 1 \end{bmatrix},$$

$$G = \begin{bmatrix} 1 & 0 & 0 & 0 & 1 & 0 & 1 & 0 & 0 & 0 & 0 & 0 \\ 0 & 1 & 0 & 0 & 0 & 1 & 0 & 1 & 0 & 0 & 0 & 0 \\ 0 & 0 & 1 & 1 & 0 & 0 & 0 & 0 & 1 & 0 & 0 & 0 \\ 0 & 0 & 1 & 0 & 1 & 0 & 0 & 0 & 1 & 0 & 1 & 0 \\ 1 & 0 & 0 & 0 & 0 & 1 & 1 & 0 & 0 & 0 & 0 & 1 \\ 0 & 1 & 0 & 1 & 0 & 0 & 0 & 1 & 0 & 1 & 0 & 0 \end{bmatrix}.$$

Thus, the LDGC encoder of the present invention is exclusively generated by the basic matrix $G_b$, the expanding factor z, and the selected basic permutation matrix.

If one basic matrix is used in the LDGC for each different expanding factor, the LDGC encoder and decoder both need to store one basic matrix for each different code length. A lot of basic matrixes shall be stored when there are a lot of code lengths, which results in problems of denotation and storage. Thus, when it is required to change the code length, in a certain range of the same code rate, a uniform format basic matrix is used for the LDGC having multiple code lengths, and the uniform basic matrix is defined here as $G_b^{uniform}$. When the code lengths are different, the generator matrix G can be obtained by modifying and expanding $G_b^{uniform}$, such that the generated encoder and decoder are applicable to the cases in which the code length is variable.

Modification means the modification performed on the non-negative values in the basic matrix $G_b$ using expanding factors with different code lengths. The value of the modified element shall be smaller than the value of the expanding factor with the code length. There are many kinds of modification algorithms, such as mod, scale+floor, and scale+round. Assume $P_{ij}$ is an element which is not −1 in Row i and Column j of the basic matrix $G_b$, and $P'_{ij}$ is an element which is not −1 in Row i and Column j of the modified matrix $G_b^{modified}$, $$P'_{ij} \equiv P_{ij} \bmod z \equiv P_{ij} \bmod \frac{N}{n_b}$$

for the method of mod;

$$P'_{ij} = \left\lfloor P_{ij} \times \frac{z}{z_{max}} \right\rfloor = \left\lfloor P_{ij} \times \frac{N}{N_{max}} \right\rfloor$$

for the method of scale+floor; and $$P'_{ij} = \text{Round}\left(P_{ij} \times \frac{z}{z_{max}}\right) = \text{Round}\left(P_{ij} \times \frac{N}{N_{max}}\right)$$

for the method of scale+round, wherein z is the expanding factor corresponding to current code length, i.e., the number of rows or the number of columns of the block matrix; $z_{max}$ is the expanding factor corresponding to the maximum supported code length; and mod is operation of Mod, ⌊ ⌋ is operation of floor, and Round is operation of rounding.

The LDGC of the present invention are encoding and decoding codes capable of achieving the LDGC with any code length by modifying and expanding a uniform basic matrix based on an LDGC mother code set having variable code lengths. The embodiments of the present invention are described hereinafter in detail in conjunction with the drawings thereof.

Figure 2:
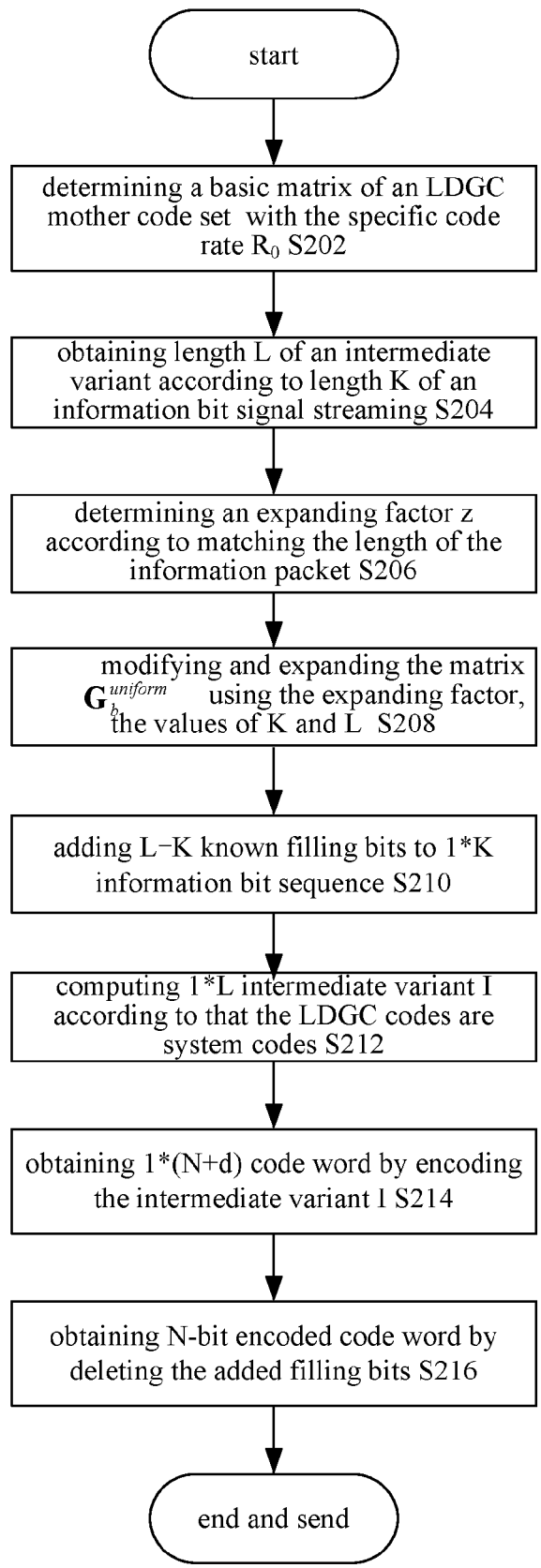
FIG. 2 is a flowchart of the encoding method for the LDGC according to an embodiment of the present invention.

The encoding method for the LDGC according to the embodiments of the invention is described with reference to FIG. 2. Wherein, the method shown in FIG. 2 is the process of encoding an information bit signal stream with length K to output an encoded information bit signal stream with length N to the subsequent processing means for processing, wherein the length of a parity bit is M=N−K, and the code rate is r=K/N. As shown in FIG. 2, the method comprises the following steps:

step S202, determine a uniform basic matrix $G_b^{uniform}$ of an LDGC mother code set with a specific code rate $R_0$, wherein the LDGC mother code set is constructed using P LDGC with code rate $R_0$ and different code lengths (N=z×$n_b$, K=z×$k_b$), wherein $$R_0 = \frac{k_b}{n_b},$$

much smaller than the code rate required in practical encoding. Zset is a set of expanding factors, the expanding factor z may be any element in Zset, and Zset is a set composed of P positive integers larger than 0 $z_1<z_2<\ldots<z_{k-1}<z_k<\ldots<z_p$. Wherein, $n_b$ (determined integer larger than 2) denotes the number of columns of the basic matrix $G_b^{uniform}$, and $k_b$ (determined integer larger than or equal to 1) denotes the number of rows of the basic matrix $G_b^{uniform}$. As shown in FIG. 1, a square matrix $G_b^{uniform}$ (1:$k_b$,1:$k_b$) composed of $k_b$ rows and the front $k_b$ columns of the basic matrix $G_b^{uniform}$ is a special upper triangular or lower triangular matrix, and all the LDGC having a practical code rate larger than $R_0$ can be generated by encoding through the basic matrix $G_b^{uniform}$.

Step S204, obtain the value of length L of an intermediate variant according to length K of the information bit signal stream. Specifically, there is certain relation existing between the length K of the information bit signal stream and the length L of the intermediate variant, i.e. L=modify (a×K+b), wherein modify( ) denotes integer modification by the method of ceil, floor, or round; wherein a is a positive rational number slightly larger than 1, b is a positive integer, and L can be computed according to the relation.

Step S206, determine an expanding factor by matching the length of the information packet so as to determine the parameters and matrixes needed for encoding according to the expanding factor and the basic matrix $G_b^{uniform}$, wherein, the expanding factor $z_t$ is determined using a specific formula $$z_t = \frac{L}{k_b}$$

for the expanding factor, and it is determined that $z_t$ has a relation of $z_{k-1}<z_t\leq z_k$ with elements in Zset, wherein $z_{k-1}$, $z_k$ are elements in Zset and adjacent in value, and the expanding factor needed for encoding is $z_k$.

Step S208, based on the uniform basic matrix $G_b^{uniform}$ and the expanding factor $z_k$, obtain the modified basic matrix $G_b^{modified}$ according to specific modification algorithm, and obtain an unmodified generator matrix G' using the expanding factor $z_k$ to expand $G_b^{modified}$; modify G' with the modification method of increasing column weight of some columns (i.e. increasing the number of element 1 in the columns) to obtain the final generator matrix $G_{ldgc}$, wherein the matrix $G_{ldgc}$ (1:L, 1:N+L−K) composed of L rows and the front N+L−K columns of the generator matrix $G_{ldgc}$ is the matrix needed for encoding.

It shall be noted that, the column weight may be increased by replacing some of the columns in G' with columns which are heavier in column weight and produced additionally, or by adding other columns in G' to these columns, or directly increasing the number of element 1 in these columns. Moreover, it is not limited to the above mentioned three methods. However, it shall be ensured that the square matrix composed of L rows and the front L columns of the final generator matrix $G_{ldgc}$ is still an upper triangular or lower triangular matrix.

Step S210, in the case that the square matrix $G_b^{uniform}$ (1:$k_b$,1:$k_b$) composed of $k_b$ rows and the front $k_b$ columns of the basic matrix is a left upper triangular or left lower triangular matrix, fill the L−K known bits in the front of K-bit information bit signal stream (information bit s) to be encoded to generate a new information bit signal stream m with the length L; and in the case that the matrix $G_b^{uniform}$ (1:$k_b$,1:$k_b$) is a right upper triangular or right lower triangular matrix, fill the L−K known bits in the end of K-bit information bit signal stream (information bit s) to be encoded to generate a new information bit signal stream m with the length L. It shall be noted that the positions for filling bits are not limited to those described above.

Step S212, generate the intermediate variant I for the filled information bit signal stream m using the square matrix $G_{ldgc}$ (1:L,1:L) composed of L rows and the front L columns of the generator matrix $G_{ldgc}$ and the information bit signal stream m with the length L according to I×$G_{ldgc}$ (1:L,1:L)=m, as the LDGC are system codes.

Step S214, generate an encoded signal stream with length N+L−K by encoding the intermediate variant I with the generator matrix $G_{ldgc}$, according to C=I×$G_{ldgc}$.

Step S216, generate the encoded signal stream with the length N by deleting L−K known bits from the encoded signal stream with the length N+L−K.

The encoding method for LDGC according to the embodiment of the present invention is described hereinafter with a practical example.

First of all, an LDGC mother code set is modified to obtain a modified basic matrix. A uniform basic matrix for the structured LDGC mother code set having a code rate $R_0$=⅓ and a plurality of code lengths has the size of $k_b$×$n_b$=12×36. The expanding factor of the mother code set is increased from $z_{min}$=2 to $z_{max}$=683 with a step length 1, which is recorded as z∈Zset={$z_{min}$:1:$z_{max}$}. As one specific code length corresponds to one specific expanding factor z, the length of information packet is increased from $z_{min}$×$k_b$ to $z_{max}$×$k_b$ with a step length $k_b$, which is recorded as K∈{$z_{min}$×$k_b$:$k_b$:$z_{max}$×$k_b$}={24:12:8196}. The uniform basic matrix $G_b^{uniform}$ for the mother code set with a code rate $R_0$=⅓is shown as follows: $G_b^{uniform}$=[$G_b^{uniform}$|$G_b^{parity}$]. Wherein, $$G_b^{system} = \begin{pmatrix} 0 & 255 & -1 & 512 & -1 & -1 & -1 & -1 & -1 & -1 & -1 & -1 \\ -1 & 0 & 658 & -1 & -1 & -1 & 422 & 447 & -1 & 363 & -1 & -1 \\ -1 & -1 & 0 & -1 & -1 & 623 & -1 & -1 & 153 & -1 & -1 & -1 \\ -1 & -1 & -1 & 0 & 628 & 291 & -1 & -1 & -1 & 461 & -1 & -1 \\ -1 & -1 & -1 & -1 & 0 & -1 & -1 & 227 & -1 & -1 & -1 & -1 \\ -1 & -1 & -1 & -1 & -1 & 0 & 320 & -1 & -1 & -1 & -1 & -1 \\ -1 & -1 & -1 & -1 & -1 & -1 & 0 & -1 & 318 & -1 & -1 & -1 \\ -1 & -1 & -1 & -1 & -1 & -1 & -1 & 0 & -1 & -1 & -1 & -1 \\ -1 & -1 & -1 & -1 & -1 & -1 & -1 & -1 & 0 & 198 & -1 & -1 \\ -1 & -1 & -1 & -1 & -1 & -1 & -1 & -1 & -1 & 0 & -1 & -1 \\ -1 & -1 & -1 & -1 & -1 & -1 & -1 & -1 & -1 & -1 & 0 & -1 \\ -1 & -1 & -1 & -1 & -1 & -1 & -1 & -1 & -1 & -1 & -1 & 0 \end{pmatrix}, \text{ and}$$

$$G_b^{parity} = \begin{pmatrix} 367 & -1 & -1 & -1 & -1 & 580 & -1 & -1 & -1 & -1 & -1 & -1 & 285 & -1 & 135 & -1 & 593 & 302 & -1 & -1 & 520 & 626 & -1 & -1 \\ -1 & -1 & -1 & -1 & -1 & -1 & 216 & -1 & -1 & -1 & -1 & -1 & -1 & -1 & -1 & 410 & 272 & -1 & -1 & -1 & -1 & -1 & -1 & 4 \\ -1 & -1 & 131 & -1 & 330 & -1 & -1 & -1 & -1 & -1 & -1 & -1 & 609 & -1 & -1 & 585 & -1 & -1 & -1 & -1 & -1 & 679 & -1 & -1 \\ -1 & -1 & -1 & -1 & -1 & -1 & -1 & -1 & -1 & -1 & -1 & -1 & -1 & -1 & -1 & 168 & -1 & -1 & -1 & -1 & -1 & -1 & -1 & -1 \\ -1 & 183 & -1 & 42 & 150 & -1 & -1 & -1 & -1 & -1 & -1 & -1 & -1 & 225 & -1 & -1 & -1 & -1 & 331 & 529 & -1 & -1 & -1 & -1 \\ 447 & -1 & -1 & 661 & -1 & -1 & -1 & 551 & -1 & -1 & -1 & -1 & -1 & -1 & 582 & -1 & -1 & 502 & -1 & 429 & -1 & -1 & -1 & -1 \\ -1 & 374 & -1 & -1 & -1 & -1 & -1 & -1 & 464 & -1 & -1 & 478 & -1 & -1 & -1 & -1 & -1 & -1 & -1 & -1 & 545 & -1 & -1 & -1 \\ 460 & -1 & 541 & -1 & -1 & -1 & -1 & -1 & -1 & 66 & -1 & -1 & -1 & -1 & -1 & -1 & -1 & -1 & 165 & -1 & -1 & -1 & -1 & -1 \\ 1 & -1 & -1 & -1 & -1 & -1 & -1 & -1 & -1 & -1 & 364 & -1 & -1 & 661 & -1 & -1 & -1 & -1 & 56 & -1 & -1 & -1 & -1 & -1 \\ -1 & -1 & 82 & 123 & -1 & 497 & -1 & -1 & 97 & -1 & -1 & -1 & -1 & -1 & 605 & 7 & -1 & -1 & -1 & -1 & -1 & -1 & 176 & -1 \\ -1 & -1 & -1 & -1 & 327 & 231 & -1 & -1 & -1 & -1 & -1 & -1 & -1 & 69 & -1 & -1 & -1 & -1 & 242 & -1 & -1 & -1 & -1 & 266 \\ -1 & 661 & -1 & -1 & -1 & -1 & 168 & 111 & -1 & 133 & 14 & -1 & 332 & -1 & -1 & -1 & -1 & -1 & -1 & -1 & -1 & -1 & 389 & -1 \end{pmatrix}.$$

There is $1*K=1*24$ binary information bit data stream s (s can be denoted as D8AB13 in hexadecimal number) to be encoded according to the method according to the embodiments of the present invention to generate 72-bit LDGC encoded code words, thereby, there is $K=24$, $N=72$.

$L=48$ is obtained according to a relation between the length K of the information packet and the length L of the intermediate variant; the expanding factor $$z_t = \frac{48}{12} = 4$$

is determined according to a specific expanding factor formula $$z_t = \frac{L}{k_b},$$

and it could be determined that $z_t$ has a relation of $z_{k-1}=3<z_t \leq z_k=4$ with elements in Zset, wherein $z_{k-1}, z_k$ are elements in Zset and adjacent in value, and $z=z_k=4$ is the expanding factor needed for encoding.

In order to achieve the encoding and decoding of $(z \times k_b, z \times n_b)$ LDGC, it is required to modify the uniform basic matrix $G_b^{uniform}$ using a certain modification algorithm and expanding factor z as described above to obtain the modified basic matrix $G_b^{modified}$, so as to obtain a generator matrix according to $G_b^{modified}$ and z. In this embodiment, the uniform basic matrix is modified according to the modification rounding formula of (Scale+floor), and the modification is performed on element $(g_{ij}^b)_{uniform}$ denoting nonzero square matrix in $G_b^{uniform}$, wherein $$z_{max} = 683: (g_{ij}^b)_{modified} = \left\lfloor (g_{ij}^b)_{uniform} \times \frac{z}{z_{max}} \right\rfloor = \left\lfloor (g_{ij}^b)_{uniform} \times \frac{z}{683} \right\rfloor.$$

The following modified basic matrix corresponding to the LDGC can be obtained by modifying the above mentioned $G_b^{uniform}$:

$$G_b^{modified} =$$

$$\begin{pmatrix}
1 & -1 & -1 & -1 & -1 & -1 & -1 & -1 & -1 & -1 & -1 & -1 \\
-1 & 0 & -1 & -1 & -1 & -1 & -1 & -1 & -1 & -1 & -1 & -1 \\
-1 & 2 & 3 & -1 & -1 & 3 & -1 & -1 & -1 & 0 & -1 & -1 \\
3 & -1 & 3 & -1 & -1 & -1 & 3 & -1 & -1 & -1 & -1 & -1 \\
0 & 0 & -1 & -1 & -1 & -1 & -1 & -1 & -1 & 3 & -1 & -1 \\
-1 & -1 & -1 & -1 & 1 & -1 & -1 & -1 & 0 & -1 & -1 & -1 \\
3 & -1 & -1 & -1 & 3 & 2 & -1 & 0 & -1 & -1 & -1 & -1 \\
-1 & -1 & -1 & -1 & -1 & -1 & -1 & -1 & -1 & -1 & 1 & 2 \\
-1 & -1 & 3 & -1 & -1 & -1 & -1 & -1 & -1 & -1 & -1 & 1 \\
-1 & -1 & -1 & -1 & 2 & -1 & -1 & -1 & -1 & -1 & 1 & -1 \\
-1 & -1 & -1 & -1 & -1 & -1 & -1 & 3 & -1 & 0 & -1 & -1 \\
3 & 1 & -1 & 0 & -1 & -1 & -1 & -1 & -1 & -1 & -1 & -1 \\
-1 & -1 & -1 & -1 & -1 & -1 & 2 & -1 & -1 & -1 & -1 & -1 \\
-1 & -1 & -1 & -1 & -1 & -1 & -1 & 2 & -1 & -1 & 0 & -1 \\
-1 & -1 & -1 & -1 & -1 & 0 & -1 & -1 & -1 & 0 & -1 & -1 \\
-1 & -1 & -1 & -1 & -1 & 2 & -1 & -1 & 0 & -1 & -1 & -1 \\
-1 & -1 & -1 & -1 & 3 & -1 & -1 & -1 & -1 & -1 & 0 & -1 \\
-1 & 1 & -1 & -1 & -1 & -1 & -1 & -1 & -1 & -1 & 0 & -1 \\
3 & -1 & -1 & -1 & -1 & -1 & -1 & -1 & 2 & 1 & -1 & -1 \\
-1 & -1 & 1 & 0 & -1 & -1 & -1 & -1 & -1 & -1 & 1 & -1 \\
-1 & -1 & -1 & 0 & 3 & -1 & -1 & -1 & 0 & -1 & -1 & -1 \\
-1 & -1 & 0 & -1 & -1 & -1 & 3 & -1 & 0 & -1 & -1 & -1 \\
-1 & -1 & -1 & 1 & -1 & 2 & -1 & -1 & -1 & -1 & -1 & 3 \\
2 & -1 & -1 & -1 & 2 & -1 & 2 & 0 & -1 & -1 & -1 & -1 \\
-1 & -1 & -1 & -1 & -1 & -1 & -1 & -1 & -1 & -1 & -1 & 0 \\
-1 & -1 & -1 & -1 & -1 & -1 & -1 & -1 & 0 & -1 & -1 & -1 \\
-1 & 2 & 2 & -1 & -1 & -1 & 1 & 0 & -1 & -1 & -1 & -1 \\
-1 & -1 & 0 & -1 & -1 & 1 & 0 & -1 & -1 & -1 & -1 & -1 \\
-1 & 2 & -1 & -1 & 1 & -1 & 0 & -1 & -1 & -1 & -1 & -1 \\
-1 & 2 & -1 & -1 & 1 & 0 & -1 & -1 & -1 & -1 & -1 & -1 \\
-1 & -1 & 3 & 1 & 0 & -1 & -1 & -1 & -1 & -1 & -1 & -1 \\
-1 & -1 & 3 & 0 & -1 & -1 & -1 & -1 & -1 & -1 & -1 & -1 \\
2 & -1 & 0 & -1 & -1 & -1 & -1 & -1 & -1 & -1 & -1 & -1 \\
-1 & 3 & 0 & -1 & -1 & -1 & -1 & -1 & -1 & -1 & -1 & -1 \\
1 & 0 & -1 & -1 & -1 & -1 & -1 & -1 & -1 & -1 & -1 & -1 \\
0 & -1 & -1 & -1 & -1 & -1 & -1 & -1 & -1 & -1 & -1 & -1
\end{pmatrix}$$

Figure 3:
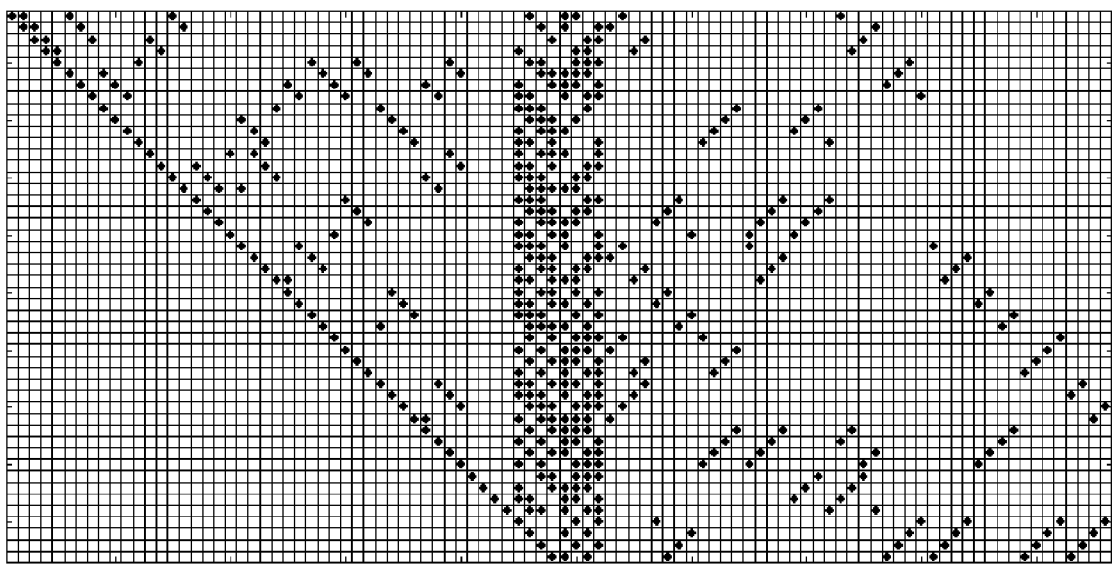
FIG. 3 is a schematic diagram of the generator matrix of LDGC according to an embodiment of the present invention.

L*(N+L−K) generator matrix G is obtained by expanding $G_b^{modified}$ with the expanding factor $z_k$, modification is made from Column L−$z_k$=44 to Column L+$z_k$=48 in G', and column weight of G' (:,L−$z_k$:L+$z_k$) is increased (i.e. increasing the number of element 1 in the columns); meanwhile, modification is made from Column 1 to Column $z_k$ in G' such that some of the columns from Column 1 to Column $z_k$ in G have the column weight of 2, the modified matrix is $G_{ldgc}$ (1:L,1:N+L−K)=$G_{ldgc}$ (1:48,1:96), and the modified matrix $G_{ldgc}$ is composed of a plurality of $z_k*z_k$ square block matrixes, as shown in FIG. 3 (wherein, the black point denotes element 1, and the blank position denotes element 0).

As the square matrix $G_b^{uniform}$(1:$k_b$,1:$k_b$) composed of $k_b$ rows and the front $k_b$ columns of the basic matrix $G_b^{uniform}$ is a right upper triangular matrix, d=L−K=24 known filling bits p (p can be denoted as 9A0C2C in hexadecimal system) are added in the end of input information stream s to obtain 1*L=1*48 information bit stream m (m can be denoted as D8AB139A0C2C in hexadecimal).

According to the characteristic that LDGC are system codes (the LDGC codes are system codes, thus, I×$Gr_{ldgc}$(1:48,1:48)=m), and that $G_{ldgc}$ (1:L,1:L)=$G_{ldgc}$ (1:48,1:48) is a right upper triangular matrix, 1*L=1*48 intermediate variant I (I can be denoted as 942DA94E0A24 in hexadecimal) is computed by taking operations of solving formulae of the filled 1*L=1*48 information bit streaming m.

The input intermediate variant I is encoded according to C=I×$Gr_{ldgc}$ to generate 1*(N+d)=1*96 binary code word c (c can be denoted as D8AB139A0C2CCD3AC516ED52 in hexadecimal).

The added d=24 filling bits are deleted from 1*(N+d)=1*96 binary code word c to finally obtain N=72 bit encoded code word (denoted as D8AB13CD3AC516ED52 in hexadecimal system) for sending out.

Figure 4:
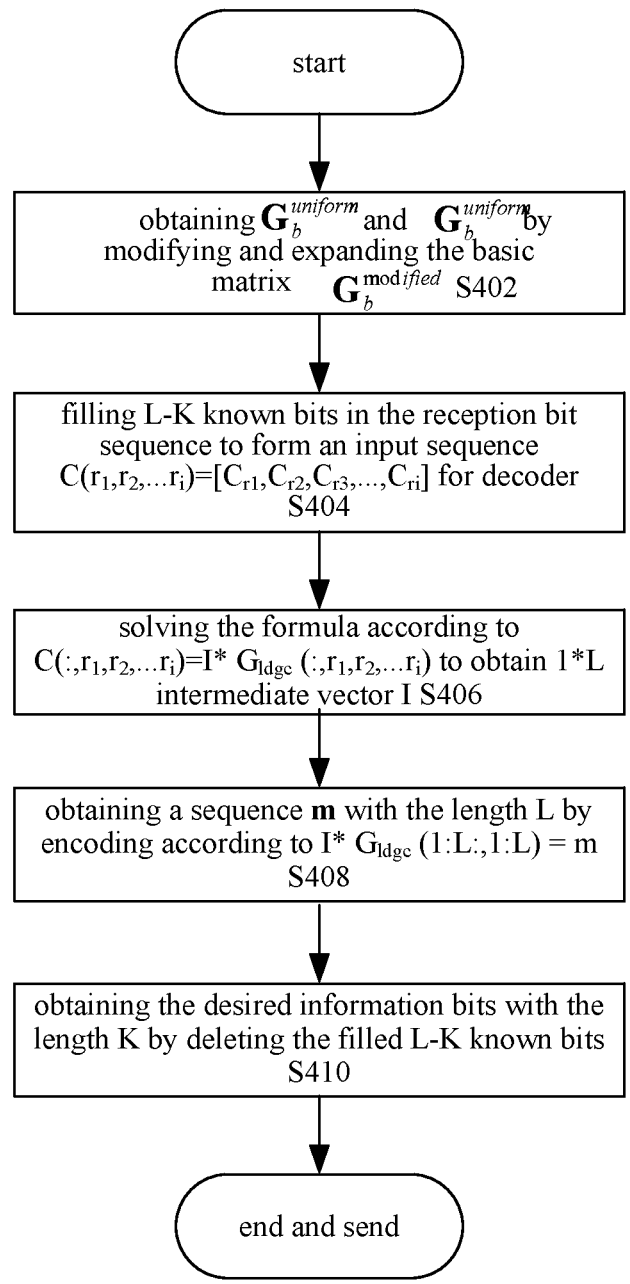
FIG. 4 is a flowchart of the decoding method for LDGC according to an embodiment of the present invention.

The decoding method for the LDGC according to the embodiment of the present invention is described with reference to FIG. 4. The method shown in FIG. 4 is to decode the information bit signal stream after passing the erasure channel to output the information bit signal stream with the length K to the subsequent processing means. Suppose after passing the erasure channel, E bits of the front K bits are erased. As shown in FIG. 4, the method comprises the following steps:

step S402, obtain a reception generator matrix $G_{ldgc}$ (:,$r_1$, $r_2$, ... $r_i$) by modifying and expanding the basic matrix $G_b^{uniform}$, wherein, reference can be made to the corresponding steps of the encoding method.

Step S404, fill L−K known bits in the reception bit signal stream passing the erasure channel to form an input signal stream C($r_1$, $r_2$, ... $r_i$)=[$C_{r1}$, $C_{r2}$, $C_{r3}$, ..., $C_{ri}$] for decoder, wherein i is a position integer which satisfies L≦i≦N+L−K. Wherein, in the case that the square matrix $G_{ldgc}$ (1:L,1:L) composed of L rows and the front L columns of the generator matrix used in the encoding process is a left upper triangular or left lower triangular matrix, the L−K known bits are filled in the front of the reception bit signal stream; and in the case that the square matrix $G_{ldgc}$ (1:L,1:L) composed of L rows and the front L columns of the generator matrix used in the encoding process is a right upper triangular or right lower triangular matrix, the L−K filling bits are added in the end of K−E bits in the reception bit signal stream. It shall be noted that the positions for filling bits are not limited to those described above.

Step S406, solve the formula according to C(:,$r_1$, $r_2$, ... $r_i$)=I*$G_{ldgc}$ (:,$r_1$, $r_2$, ... $r_i$) to obtain the 1*L intermediate vector I, wherein, $G_{ldgc}$ (:,$r_1$, $r_2$, ... $r_i$) denotes the reception generator matrix $G_{ldgc}$ (:,$r_1$, $r_2$, ... $r_i$) corresponding to the received information bits, which retains column vectors corresponding to the serial numbers of all the non-erasure positions in the generator matrix $G_{ldgc}$ (1:L,1:N+L−K) used in the encoding process. Specifically, the process of computing the intermediate vector I comprises the following steps: generate a L*L upper triangular matrix in the matrix $G_{ldgc}$ (:,$r_1$, $r_2$, ... $r_i$) using the special Gaussian elimination method; perform permutation and addition on the received code words according to row permutation and row elimination operation on the matrix comprising L*L upper triangular matrix; perform permutation on the intermediate variant according to column permutation operation on the matrix comprising L*L upper triangular matrix; and solving upper trigonometric recursive formula using the backward substitution method to finally obtain the intermediate variant I. Wherein, the process of generating a matrix comprising L*L upper triangular matrix by recursive method using Gaussian elimination method comprises the following steps: select a row with the lightest row weight (the number of element 1 in the rows) in $G_{ldgc}$ (j:L,$r_1$, $r_2$, ... $r_i$) to perform row permutation with Row j; perform column permutation between the column where the first nonzero element of Row j lies and Column j in the matrix; and eliminate the nonzero elements between Row j+1 and the last row in Column j with the element in Row j and Column j using row elimination method. Wherein, the failure in generating the matrix comprising L*L upper triangular matrix indicates a failure in solving the formula.

Step S408, obtain a signal stream m with length L by encoding according to I*$G_{ldgc}$ (1:L:,1:L)=m.

Step S410, obtain the desired information bits with length K by deleting the filled L−K known bits.

The decoding method for the LDGC according to the embodiment of the present invention is described hereinafter with a practical example.

First of all, an LDGC mother code set is modified and expanded with the method identical to that used in encoding process described above to obtain a modified basic matrix and an expanded generator matrix, identical to those obtained in encoding process described above. The code words with the specific code rate $R_0$=⅓ and the length K=24 of information packet are decoded, and the basic matrix $G_b^{modified}$ and the generator matrix $G_{ldgc}$ used at the decoding end are the same as those at the encoding end.

There is a binary bit stream c' with the length K=24 of information packet reaching the decoding end after passing the erasure channel, and c' can be denoted as D(X)AB13CD3(X)C516ED52 in hexadecimal, wherein (X) denotes that the bit at the position is erased, E=4 bits are erased in K=24 information packet bits, and the erasure positions are the 5$^{th}$, 6$^{th}$, 7$^{th}$, 8$^{th}$ positions. As $G_b^{modified}$ is a right upper triangular matrix, L−K=24 known bits are added in the end of K−E=20 bits to form a new reception code word stream c which can be denoted as c=DAB139A0C2CCD3C516ED52, [$r_1$, $r_2$, ... $r_i$]=[1:4, 9:36, 41:96] in hexadecimal, and the corresponding generator matrix used in computing the intermediate variant by decoding is $G_{Idgc}$=$G_{ldgc}$(1:L, $G_{ldgc}$(1:48, [1:4, 9:36, 41:72]).

Figure 5:
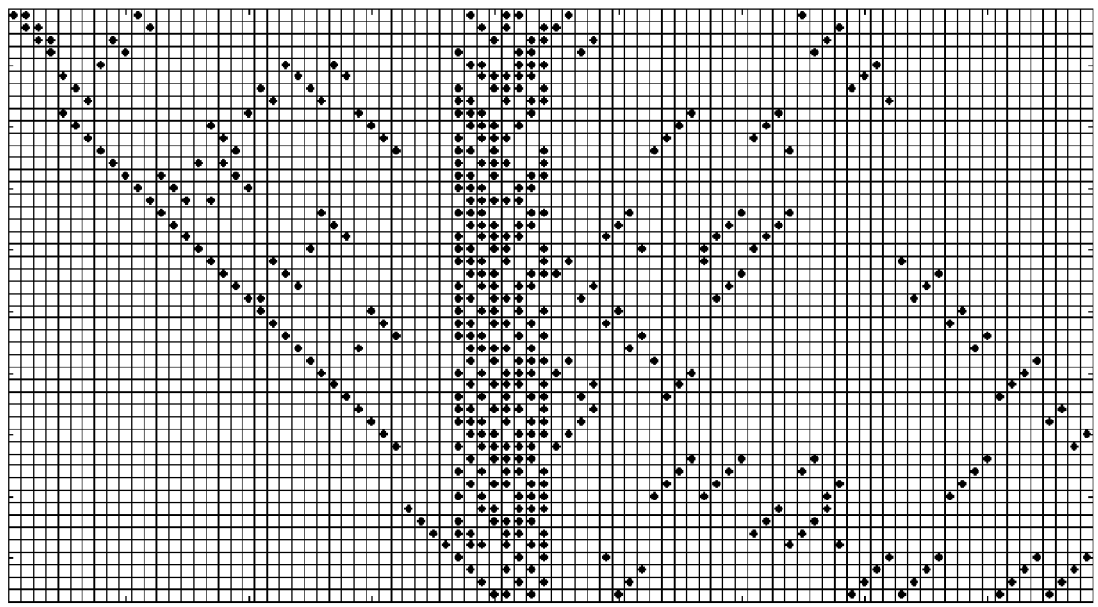
FIG. 5 is a schematic diagram of the LDGC generator matrix passing the erasure channel according to an embodiment of the present invention.
Figure 6:
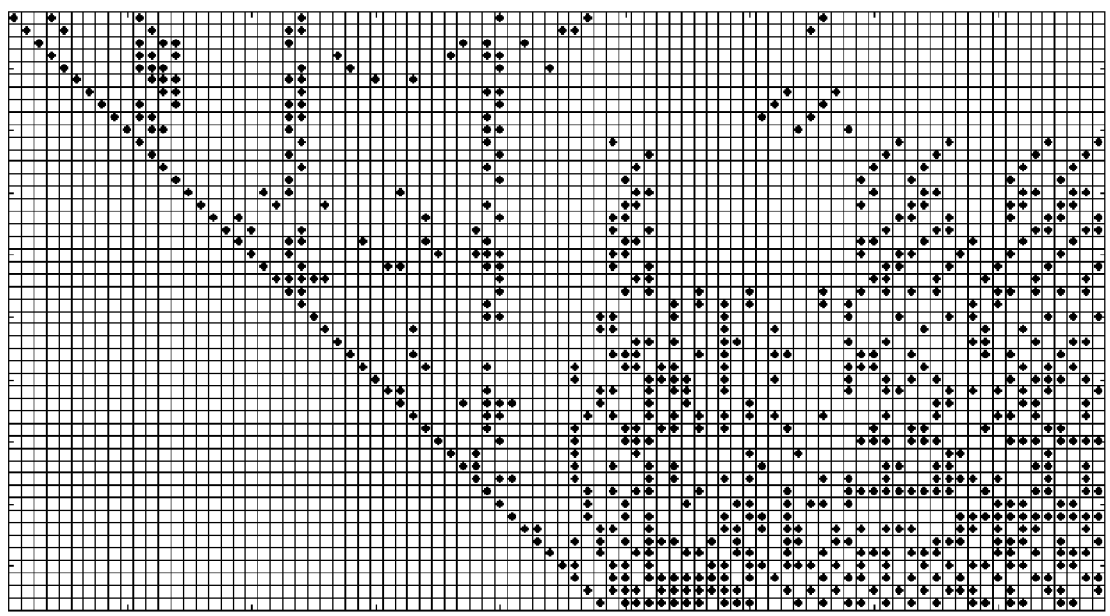
FIG. 6 is a schematic diagram of a right upper triangular matrix generated in the LDGC generator matrix using Gaussian elimination method according to an embodiment of the present invention.

A L*L=48*48 right upper triangular matrix is generated in G'$_{ldgc}$ using Gaussian elimination method (FIG. 5 and FIG. 6 respectively illustrate the forms of the generator matrix G'$_{Idgc}$ before and after the special Gaussian elimination method is carried out), and at the same time, permutation and addition are performed on the received code words according to row permutation and row elimination operation of the matrix; and permutation is performed on the intermediate variant according to column permutation operation of the matrix.

The intermediate variant I=942DA94E0A24 is obtained by solving upper trigonometric formula according to the backward substitution method, and according to I*$G_{ldgc}$ (1:L:1:L)= I*$G_{ldgc}$(1:48:,1:48)=m, a signal stream m with the length L is obtained by encoding, and is denoted as D8AB139A0C2C in hexadecimal.

The desired information bit s with the length K=24 is obtained by deleting the filled L−K=48−24=24 known bits, wherein s is denoted as D8AB13 in hexadecimal.

Figure 7:
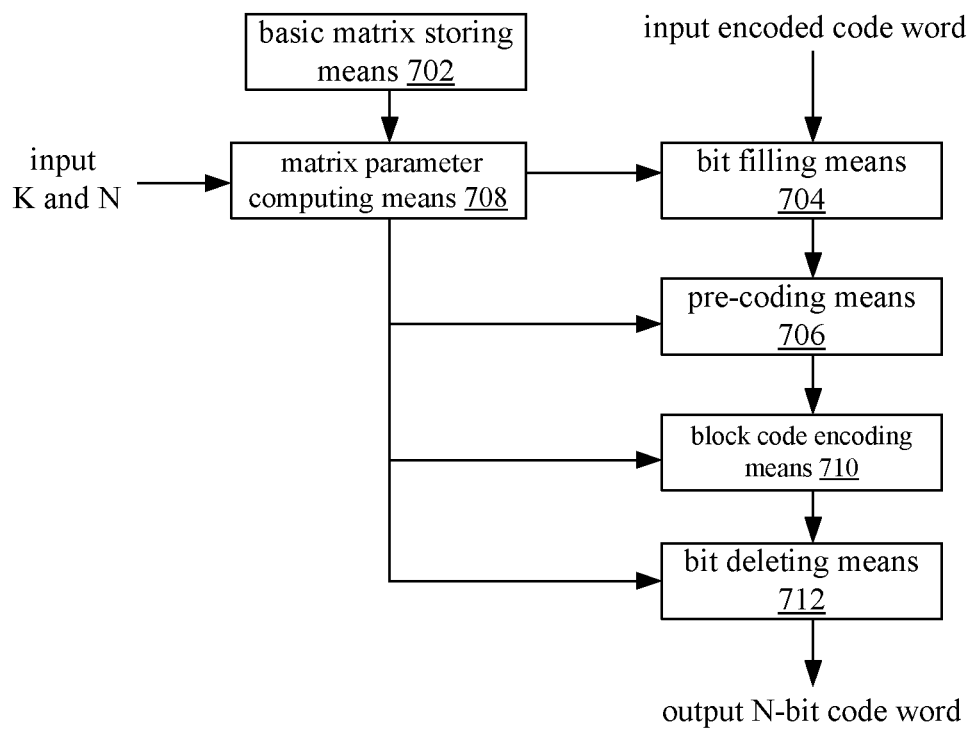
FIG. 7 is a block diagram of the encoding device of LDGC according to an embodiment of the present invention.

The encoding device for the LDGC according to the embodiment of the present invention is described with reference to FIG. 7. As shown in FIG. 7, the encoding device comprises: basic matrix storing means 702, bit filling means 704, pre-coding means 706, matrix parameter computing means 708, block code encoding means 710, and bit deleting means 712.

The basic matrix storing means is used for storing uniform $k_b \times n_b$ basic matrix $G_b^{uniform}$ and outputting the basic matrix to the matrix parameter computing means, wherein, the square matrix $G_b^{uniform}$ (1:$k_b$,1:$k_b$) composed of $k_b$ rows and the front $k_b$ columns of the basic matrix is an upper triangular or lower triangular matrix.

The bit filling means is used for adding L−K known bits to the information bit signal stream with the length K to be encoded to generate the information bit signal stream m with the length L, and outputting m to the pre-coding means.

The pre-coding means is used for generating, according to I×$G_{ldgc}$ (1:L,1:L)=m, an intermediate variant I using the square matrix $G_{ldgc}$ (1:L,1:L) composed of L rows and the front L columns of the generator matrix $G_{ldgc}$ and the information bit signal stream m with the length L, and outputting I to the block code encoding means.

The matrix parameter computing means is used for generating the matrixes and parameters desired by the block code encoding means, and the parameters desired by the bit filling means and the bit deleting means, wherein, firstly, the expanding factor $$z_t = \frac{L}{k_b}$$

is determined, and then, it is determined that $z_t$ has a relation of $z_{k-1} < z_t \leq z_k$ with elements in Zset, wherein $z_{k-1}, z_k$ are elements in Zset and adjacent in value, and $z_k$ is an expanding factor to be output; based on the uniform basic matrix $G_b^{uniform}$ and the expanding factor $Z_k$, the modified basic matrix $G_b^{modified}$ can be obtained according to specific modification algorithm; and a generator matrix G' can be obtained by using the expanding factor $Z_k$ to expand $G_b^{modified}$, modification is made from Column L-$z_k$ to Column L+$z_k$ of G', the column weight of G'(:,L-$z_k$:L+$z_k$) is increased (i.e. increasing the number of element 1 in the columns), and the modified matrix is $G_{ldgc}$; and the generator matrix $G_{ldgc}$(1:L, 1:N+L−K), expanding factor $Z_k$, size parameters K, L, N of the matrix are input into the block code encoding means, the bit filling means, and the bit deleting means.

The block code encoding means is used for encoding information packets according to the matrixes and parameters generated by the matrix parameter computing means to generate code words for outputting to the bit deleting means.

The bit deleting means is used for deleting L−K known bits filled before from the encoded code words and outputting N code words obtained after deletion.

Figure 8:
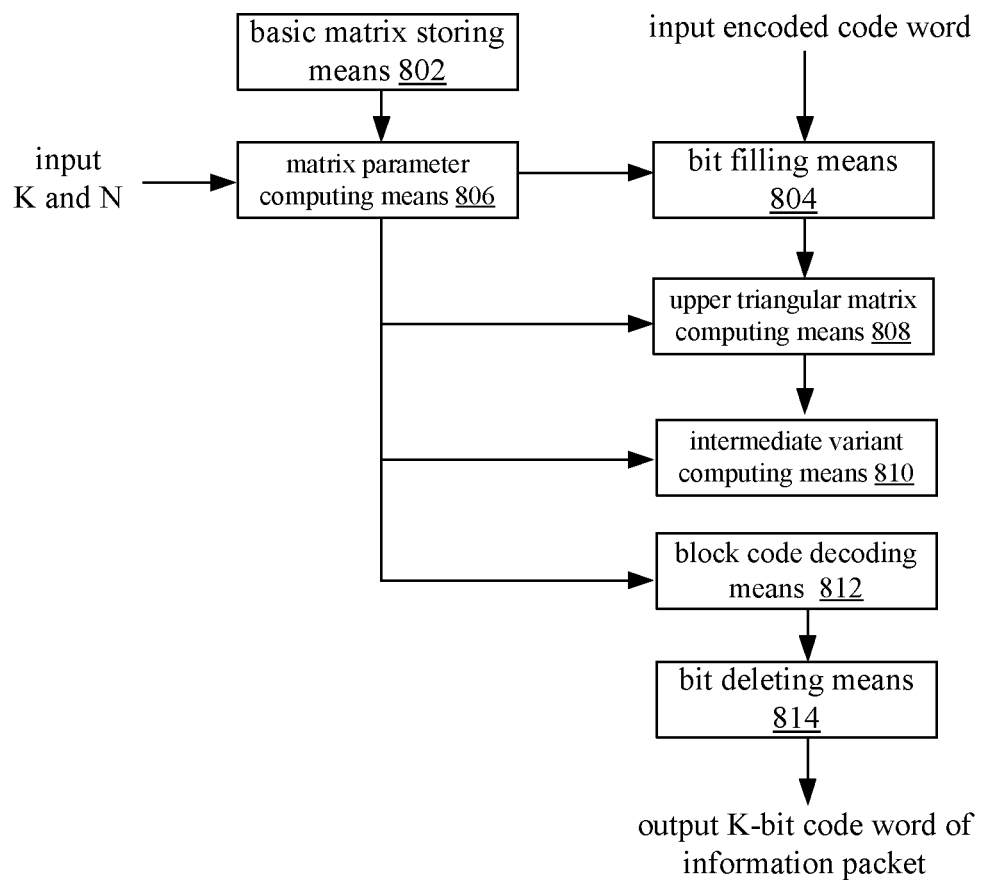
FIG. 8 is a block diagram of the decoding device of LDGC according to an embodiment of the present invention.

The decoding device for the LDGC according to the embodiment of the present invention is described with reference to FIG. 8. As shown in FIG. 8, the decoding device comprises: basic matrix storing means 802, bit filling means 804, matrix parameter computing means 806, upper triangular matrix computing means 808, intermediate variant computing means 810, block code decoding means 812, and bit deleting means 814. Wherein, the basic matrix storing means is used for storing a uniform $k_b \times n_b$ basic matrix $G_b^{uniform}$ and outputting the basic matrix to the matrix parameter computing means.

The bit filling means is used for filling L−K known bits in the reception bit signal streaming passing the erasure channel to form input signal streaming C($r_1, r_2, \ldots r_i$)=[$C_{r1}, C_{r2}, C_{r3}, \ldots, C_{ri}$] of a decoder, wherein, i is a positive integer which satisfies L≦i≦N+L−K.

The matrix parameter computing means is used for generating matrixes and parameters desired by the block code decoding means and the upper triangular matrix computing means, and the parameters desired by the bit filling means, the bit deleting means, and upper triangular matrix computing means, wherein, firstly, the expanding factor $$z_t = \frac{L}{k_b}$$

is determined, and then, it is determined that $z_t$ has a relation of $z_{k-1} < z_t \leq z_k$ with elements in Zset, wherein $z_{k-1}, z_k$ are elements Zset and adjacent in value, and $Z_k$ is the expanding factor to be output; based on the uniform basic matrix $G_b^{uniform}$ and the expanding factor $z_k$, the modified basic matrix $G_b^{modified}$ can be obtained according to specific modification algorithm; a generator matrix G is obtained by using the expanding factor $Z_k$ to expand $G_b^{modified}$, and the matrix $G_{ldgc}$ (1:L,$r_1,r_2, \ldots r_i$) composed of L rows of the generator matrix and the columns corresponding to the serial numbers of the received bit signal stream is input into the upper triangular matrix computing means; and the generator matrix $G_{ldgc}$(1:L, 1:N+L−K) and the expanding factor $Z_k$ are input into the block code decoding means, and size parameters K, L, N of the matrix are input into the bit filling means and the bit deleting means.

The upper triangular matrix computing means is used for generating a L*L upper triangular matrix in $G_{ldgc}$ (:,$r_1, r_2, \ldots r_i$) for outputting to the intermediate variant computing means. Wherein, firstly, a row with the lightest row weight (the number of element 1 in the rows) in $G_{ldgc}$ (j:L,$r_1, r_2, \ldots r_i$) is selected to perform row permutation with Row j; column permutation is performed between the column where the first nonzero element of Row j lies and Column j in the matrix; and the row elimination method is used to eliminate the nonzero elements between Row j+1 and the last row in Column j with the element in Row j and Column j. Then, permutation and addition are performed on the reception code words according to row permutation and row elimination operation on the matrix comprising L*L upper triangular matrix; permutation is performed on the arrangement order of the intermediate variant according to column permutation operation of the matrix comprising L*L upper triangular matrix; and the arrangement order of the generated upper triangular matrix and the newly reception code words as well as the intermediate variant is input into the intermediate variant computing means.

The intermediate variant computing means is used for solving the upper trigonometric formula using the backward substitution method according to C(:,$r_1, r_2, \ldots r_i$)=I*$G_{ldgc}$ (1:L,$r_1, r_2, \ldots r_i$) to obtain 1*L intermediate vector I.

The block code decoding means is used for encoding the binary bit signal stream input by the decoding device using the matrixes and parameters generated by the matrix parameter computing means to obtain a signal stream m with the length k+d according to $I*G_{ldgc}(:,1:L)=m$ for outputting to the bit deleting means.

The bit deleting means is used for deleting a certain number of code word bits from the encoded code words and outputting K code words obtained after deletion.

The descriptions above are only preferable embodiments of the present invention, which are not used to restrict the present invention. For those skilled in the art, the present invention may have various changes and variations. Any amendments, equivalent substitutions, improvements etc. within the spirit and principle of the present invention are all concluded in the scope of the claims of the present invention.

What is claimed is:

1. An encoding method executed by an encoding device for Low Density Generator matrix Codes, LDGC, comprising the following steps:

step 1, constructing, by using a processor, an LDGC mother code set using P LDGC, wherein P denotes there are total P LDGC in the LDGC mother set, with code rate $R_0$ and different code lengths, wherein the LDGC mother code set has a uniform basic matrix $G_b^{uniform}$, $R_0=k_b/n_b$, $k_b$ denotes the number of rows in the basic matrix, and $n_b$ denotes the number of columns in the basic matrix;

step 2, obtaining length L of a intermediate variant according to length K of an information bit sequence to be encoded in the LDGC mother code set;

step 3, modifying and expanding the basic matrix to obtain a generator matrix $G_{ldgc}$ using the length L of the intermediate variant and the number $k_b$ of rows in the basic matrix; and step 4, encoding the information bit sequence to be encoded using a matrix $G_{ldgc}(1:L, 1:N+L-K)$ composed of L rows and the front N+L-K columns of the generator matrix, wherein N denotes the length of the encoded information, K denotes the length of the information bit sequence.

2. The encoding method according to claim 1, wherein in step 2, the length L of the intermediate variant is obtained using the length K of the information bit sequence to be encoded through a formula L=modify(a×K+b), wherein modify( ) denotes integer modification, the modification method is ceiling, floor, or rounding, a is a positive rational number slightly larger than 1, and b is a positive integer.

3. The encoding method according to claim 1, wherein step 3 further comprises the following steps:

step a, obtaining an expanding factor $z_t$ using the length L of the intermediate variant and the number $k_b$ of rows of the basic matrix through a formula $z_t=L/k_b$, and finding an expanding factor $Z_k$, which has a relation of $z_{k-1}<z_t\leq z_k$ with the expanding factor $z_t$ and is used for processing the basic matrix, from an expanding factor set $Z_{set}$ composed of P positive integers larger than 0 $z_1<z_2<\ldots<z_{k-1}<z_k<\ldots<z_p$ and corresponding to the LDGC mother code set;

step b, modifying the basic matrix to obtain a modified basic matrix $G_b^{modified}$ using the expanding factor $Z_k$ for processing the basic matrix;

step c, expanding the modified basic matrix to obtain an unmodified generator matrix G' using the expanding factor $Z_k$ for processing the basic matrix;

and step d, modifying the unmodified generator matrix G' to obtain the generator matrix $G_{ldgc}$.

4. The encoding method according to claim 1, wherein step 4 further comprises the following steps:

step e, filling L−K known bits in the information bit sequence to be encoded to generate an information bit sequence m with the length L;

step f, according to a formula $I \times C_{ldgc}(1:L,1:L)=m$, obtaining the intermediate variant I using a square matrix $G_{ldgc}(1:L,1:L)$ composed of L rows and the front L columns of the generator matrix and the information bit sequence m with the length L, and according to a formula $C=I \times C_{ldgc}$, encoding the intermediate variant using the matrix $G_{ldgc}(1:L, 1:N+L-K)$ composed of L rows and the front N+L−K columns of the generator matrix to generate a first encoding result with the length N+L−K; and step g, deleting L−K known bits from the first encoding result with the length N+L−K to generate a second encoding result with the length N.

5. The encoding method according to claim 1, wherein the number $k_b$ of the rows of the basic matrix is an integer larger than 2, and the number $n_b$ of the columns of the basic matrix is an integer larger than or equal to 1.

6. The encoding method according to claim 5, wherein in step d, the generator matrix $G_{ldgc}$ is obtained by increasing the column weight of a specific column of the unmodified generator matrix G'.

7. An encoding device for Low Density Generator matrix Codes, LDGC, comprising:

basic matrix storing means, for storing a uniform basic matrix $G_b^{uniform}$ of an LDGC mother code set constructed using P LDGC, wherein P denotes there are total P LDGC in the LDGC mother code set, with code rate $R_0$ and different code lengths, wherein $R_0=k_b/n_b$, $k_b$ denotes the number of rows in the basic matrix, and $n_b$ denotes the number of columns in the basic matrix;

matrix parameter computing means, for computing length L of a intermediate variant according to the relation between length K of an information bit sequence to be encoded in the LDGC mother code set and the length L of the intermediate variant, computing an expanding factor $Z_k$ for processing the basic matrix using the length L of the intermediate variant and the number $k_b$ of rows of the basic matrix, and performing modifying and expanding computation on the basic matrix to obtain a generator matrix $G_{ldgc}$ using the expanding factor $Z_k$;

bit filling means, for adding L−K known bits to the information bit sequence to be encoded to generate an information bit sequence m with the length L; pre-coding means, for obtaining, according to a formula $I \times G_{ldgc}(1:L,1:L)=m$, the intermediate variant I using a square matrix $G_{ldgc}(1:L,1:L)$ composed of L rows and the front L columns of the generator matrix and the information bit sequence m with the length L;

block code encoding means, for encoding the intermediate variant using a matrix $G_{ldgc}(1:L, 1:N+L-K)$ composed of L rows and the front N+L−K columns of the generator matrix to generate a first encoding result with length N+L−K, wherein N denotes the length of the encoded information, K denotes the length of the information bit sequence; and bit deleting means, for deleting L−K known bits from the first encoding result with the length N+L−K to generate a second encoding result with length N.

8. The encoding device according to claim 7, wherein the square matrix $G_b^{uniform}(1:k_b,1:k_b)$ composed of $k_b$ rows and the front $k_b$ columns of the basic matrix is an upper triangular or lower triangular matrix.

9. The encoding device according to claim 8, wherein the matrix parameter computing means obtains an expanding factor $z_t$ using the length L of the intermediate variant and the number $k_b$ of rows of the basic matrix according to a formula $z_t=L/k_b$, and finds an expanding factor having a relation of $z_{k-1}<z_k \leq z_k$ with the expanding factor $z_t$ from an expanding set $Z_{set}$ composed of P positive integers larger than 0 $z_1<z_2<\ldots<z_{k-1}<z_k<\ldots<z_p$ and corresponding to the LDGC mother code set, so as to obtain $Z_k$ for processing the basic matrix.

10. The encoding device according to claim 9, wherein the matrix parameter computing means modifies the basic matrix to obtain a modified basic matrix $G_b^{modified}$ using the expanding factor $Z_k$ for processing the basic matrix, expands the modified basic matrix to obtain an unmodified generator matrix G' using the expanding factor $Z_k$ for processing the basic matrix, and modifies the unmodified generator matrix G' to obtain the generator matrix $G_{ldgc}$; the matrix parameter computing means modifies the unmodified generator matrix G' by increasing the column weight of a specific column of the unmodified generator matrix G'.

11. A decoding method executed by a decoding device for Low Density Generator matrix Codes, LDGC, comprising the following steps:

step 1, obtaining a reception generator matrix $G_{ldgc}$ (:$r_1, r_2, \ldots r_i$,), wherein i is a positive integer which satisfies L≦i≦N+L−K, by modifying and expanding a basic matrix $G_b^{uniform}$ using an expanding factor $Z_k$ used in an encoding process by using a processor;

step 2, filling L−K known bits in encoded LDGC having passed an erasure channel to obtain LDGC C($r_1, r_2, \ldots r_i$)=[$C_{r1}, C_{r2}, C_{r3}, \ldots, C_{ri}$], wherein C($r_1, r_2, \ldots r_i$) is an input signal stream, to be decoded, wherein i is a positive integer which satisfies L≦i≦N+L−K, L is the length of an intermediate variant used in the encoding process, N is the length of encoded LDGC having not passed the erasure channel, K is the length of LDGC before encoding;

step 3, according to a formula C(:,$r_1, r_2, \ldots r_i$)=I*$G_{ldgc}$(:,$r_1, r_2, \ldots r_i$), obtaining 1*L reception intermediate vector I using the reception generator matrix and the LDGC to be decoded;

step 4, according to a formula I*$G_{ldgc}$(1:L,1:L)=m, obtaining a decoding result m with length L using a square matrix $G_{ldgc}$(1:L,1:L) composed of L rows and the front L columns of the reception generator matrix and the reception intermediate vector; and step 5, obtaining a decoding result with length K by deleting the L−K known bits from the decoding result m with the length L.

12. The decoding method according to claim 11, wherein the reception generator matrix retains column vectors corresponding to the serial numbers of all the non-erasure positions in the matrix $G_{ldgc}$(1:L,1:N+L−K) composed of L rows and the front N+L−K columns of the generator matrix used in the encoding process, wherein N denotes the length of the encoded information, K denotes the length of the information bit sequence.

13. The decoding method according to claim 12, wherein step 3 comprises the following steps:

step a, performing row permutation, column permutation, and/or row elimination operation on the reception generator matrix $G_{ldgc}$(:,$r_1, r_2, \ldots r_i$) using Gaussian elimination method to obtain a matrix comprising L*L upper triangular matrix;

step b, according to the matrix comprising L*L upper triangular matrix, performing permutation and addition on the LDGC to be decoded, and performing permutation on the intermediate variant used in the encoding process; and step c, solving an upper trigonometric recursive formula by the backward substitution method to obtain the reception intermediate vector I.

14. The decoding method according to claim 13, wherein step a comprises the following steps:

selecting a row with the smallest row weight in the reception generator matrix to perform row permutation with Row j;

performing column permutation between the column where the first nonzero element of Row j lies in the reception generator matrix after the row permutation and Column j in the reception generator matrix after the row permutation; and eliminating the nonzero elements between Row j+1 and the last row in Column j in the reception generator matrix after the column permutation using the element in Row j and Column j in the reception generator matrix after the column permutation through row elimination method.

15. A decoding device for Low Density Generator matrix Codes, LDGC, comprising:

basic matrix storing means, for storing a uniform basic matrix $G_b^{uniform}$ of an LDGC mother code set constructed by using P LDGC, wherein P denotes there are total P LDGC in the LDGC mother set, with code rate $R_0$ and different code lengths, wherein $R_0=k_b/n_b$, $k_b$ denotes the number of rows in the basic matrix, and $n_b$ denotes the number of columns in the basic matrix; matrix parameter computing means, for obtaining a reception generator matrix $G_{ldgc}$(:,$r_1, r_2, \ldots r_i$), wherein i is a positive integer which satisfies L ≦i≦N+L−K, by modifying and expanding the basic matrix $G_b^{uniform}$ using an expanding factor $Z_k$ used in an encoding process; bit filling means, for filling L−K known bits in an encoded LDGC having passed an erasure channel to obtain LDGC C($r_1, r_2, \ldots r_i$)=[$C_{r1}, C_{r2}, C_{r3}, \ldots, C_{ri}$], wherein C($r_1, r_2, \ldots r_i$) is an input signal stream, to be decoded, wherein i is a positive integer which satisfies L≦i≦N+L−K is the length of an intermediate variant used in the encoding process, N is the length of encoded LDGC having not passed the erasure channel, K is the length of the LDGC before encoding;

upper triangular matrix computing means, for performing row permutation, column permutation, and/or row elimination operation on the reception generator matrix $G_{ldgc}$(:,$r_1, r_2, \ldots r_i$), using Gaussian elimination method to obtain a matrix comprising L*L upper triangular matrix; intermediate variant computing means, for obtaining, according to a formula C(:,$r_1, r_2, \ldots r_i$)=I*$G_{ldgc}$(:,$r_1, r_2, \ldots r_i$), 1*L reception intermediate vector I using the matrix comprising L*L upper triangular matrix and the LDGC to be decoded; block code decoding means, for obtaining, according to a formula I*$G_{ldgc}$(1:L,1:L)=m, a decoding result m with length L using a square matrix $G_{ldgc}$(1:L,1:L) composed of L rows and the front L columns of the reception generator matrix and the reception intermediate vector; and bit deleting means, for obtaining a decoding result with length K by deleting the L−K known bits from the decoding result m with the length L.

16. The decoding device according to claim 15, wherein the matrix parameter computing means obtains an expanding factor $z_t$, using the length L of the intermediate variant used in the encoding process and the number $k_b$ of rows of the basic matrix through a formula $z_t=L/k_b$, and finds an expanding factor having a relation of $z_{k-1}<z_t\leq z_k$ with the expanding factor $z_t$ from an expanding factor set $Z_{set}$ composed of P positive integers larger than 0 $z_1<z_2<\ldots<z_{k-1}<z_k<\ldots<z_p$ and corresponding to the LDGC mother code set, so as to obtain an expanding factor $Z_k$ used in the encoding process.

17. The decoding device according to claim 16, wherein the matrix parameter computing means modifies the basic matrix to obtain a modified basic matrix $G_b^{uniform}$ using the expanding factor $Z_k$ used in the encoding process, expands the modified basic matrix to obtain a basic generator matrix G using the expanding factor $Z_k$ used in the encoding process, and then, generates the reception generator matrix with L rows of the basic generator matrix G and columns corresponding to the serial numbers of the LDGC to be decoded.

18. The decoding device according to claim 17, wherein the upper triangular matrix computing means selects a row with the smallest row weight in the reception generator matrix to perform row permutation with Row j, performs column permutation between a column where the first nonzero element of Row j lies in the reception generator matrix after the row permutation and Column j in the reception generator matrix after the row permutation, and uses a row elimination method to eliminate the nonzero elements between Row j+1 and the last row in Column j in the reception generator matrix after the column permutation, with the element in Row j and Column j in the reception generator matrix after the column permutation, so as to obtain the matrix comprising L*L upper triangular matrix.

19. The decoding device according to claim 15, wherein in the case that the square matrix $G_{ldgc}(1:L,1:L)$ composed of L rows and the front L columns of the reception generator matrix is a left upper triangular or left lower triangular matrix, the L−K known bits are filled in the front of the encoded LDGC having passed the erasure channel.

20. The decoding device according to claim 15, wherein in the case that the square matrix $G_{ldgc}(1:L,1:L)$ composed of L rows and the front L columns of the reception generator matrix is a right upper triangular or right lower triangular matrix, the L−K known bits are filled in the end of K−E bits of the encoded LDGC having passed the erasure channel, wherein E is the number of code words erased from the front K code words after the encoded LDGC having not passed the erasure channel pass the erasure channel.

* * * * *